(12) United States Patent
Wigglesworth et al.

(10) Patent No.: US 8,304,512 B2
(45) Date of Patent: Nov. 6, 2012

(54) BENZODITHIOPHENE BASED MATERIALS COMPOSITIONS

(75) Inventors: Anthony J. Wigglesworth, Oakville (CA); Yiliang Wu, Oakville (CA); Ping Liu, Mississauga (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/689,613

(22) Filed: Jan. 19, 2010

(65) Prior Publication Data
US 2011/0178255 A1     Jul. 21, 2011

(51) Int. Cl.
*C08G 75/00* (2006.01)

(52) U.S. Cl. ......... 528/377; 528/380; 528/373; 549/43; 257/40

(58) Field of Classification Search .............. 528/377, 528/380, 373; 549/43; 257/40
See application file for complete search history.

(56) References Cited

U.S. PATENT DOCUMENTS

| | | | |
|---|---|---|---|
| 7,256,418 B2 | 8/2007 | Ong et al. | |
| 2005/0082525 A1* | 4/2005 | Heeney et al. | 257/40 |
| 2005/0277776 A1* | 12/2005 | Liu et al. | 549/59 |
| 2007/0112171 A1 | 5/2007 | Li et al. | |
| 2007/0145357 A1 | 6/2007 | Wu et al. | |
| 2007/0145371 A1 | 6/2007 | Wu et al. | |
| 2007/0145453 A1 | 6/2007 | Wu et al. | |
| 2007/0148812 A1 | 6/2007 | Wu et al. | |
| 2007/0235719 A1 | 10/2007 | Ong et al. | |
| 2007/0235726 A1 | 10/2007 | Li et al. | |
| 2007/0284572 A1 | 12/2007 | Ong et al. | |
| 2008/0006324 A1* | 1/2008 | Berke et al. | 136/263 |
| 2008/0102559 A1 | 5/2008 | Ong et al. | |
| 2008/0103286 A1 | 5/2008 | Ong et al. | |
| 2008/0103314 A1 | 5/2008 | Li et al. | |
| 2008/0108833 A1 | 5/2008 | Ong et al. | |
| 2008/0108834 A1 | 5/2008 | Ong et al. | |
| 2008/0146776 A1 | 6/2008 | Liu et al. | |
| 2009/0114909 A1 | 5/2009 | Li et al. | |

(Continued)

FOREIGN PATENT DOCUMENTS

EP    2307483 A    1/2010

(Continued)

OTHER PUBLICATIONS

Pan et al. (JACS, 2007, 129, 4112-4113).*

(Continued)

*Primary Examiner* — Shane Fang
(74) *Attorney, Agent, or Firm* — Oliff & Berridge, PLC

(57) ABSTRACT

A polymer semiconductor that includes a polythiophene having an $M_n$ from about 1,000 to about 400,000 Daltons and derived from benzodithiophene monomer segments of Formula (1)

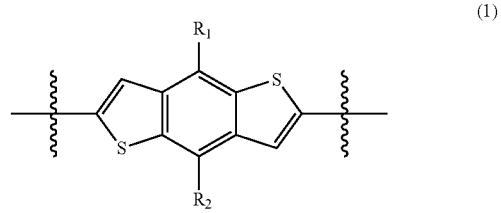

(1)

and at least one divalent linkage providing compound selected from the group consisting of an aromatic or heteroaromatic electron acceptor compound X and an aromatic or heteroaromatic compound Y, wherein $R_1$ and $R_2$ are side chains independently selected from the group consisting of a hydrogen atom, a hydrocarbon group, a heteroatom and combinations thereof.

13 Claims, 2 Drawing Sheets

U.S. PATENT DOCUMENTS

| | | | |
|---|---|---|---|
| 2009/0124788 A1 | 5/2009 | Li et al. | |
| 2009/0140236 A1 | 6/2009 | Wu et al. | |
| 2009/0140237 A1 | 6/2009 | Wu et al. | |
| 2009/0179194 A1 | 7/2009 | Wu et al. | |
| 2009/0179198 A1 | 7/2009 | Bailey et al. | |
| 2009/0181509 A1 | 7/2009 | Pan et al. | |
| 2009/0217980 A1 | 9/2009 | Pfeiffer et al. | |
| 2009/0256138 A1 | 10/2009 | Wu et al. | |
| 2009/0256139 A1 | 10/2009 | Wu et al. | |
| 2010/0078074 A1* | 4/2010 | Yang et al. | 136/263 |
| 2011/0040069 A1 | 2/2011 | Miura et al. | |

FOREIGN PATENT DOCUMENTS

| | | |
|---|---|---|
| JP | 2007-246579 A | 9/2007 |
| WO | WO 2005/014688 A2 | 2/2005 |
| WO | WO 2010/036494 A1 | 4/2010 |
| WO | WO 2010/135701 A1 | 11/2010 |

OTHER PUBLICATIONS

J. Hou et al., *Bandgap and Molecular Energy Level Control of Conjugated Polymer Photovoltaic Materials Based on Benzo[1,2-b:4,5-b']dithiophen*, Macromolecules, 2008, 41, 6012-6018.

H. Usta et al. *Air-Stable, Solution-Processable n-Channel and Ambipolar Semiconductors for Thin-Film Transistors Based on the Indenofluorenebis(dicyanovinylene) Core*, J. Am. Chem. Soc. 2008, 130 (27), 8580-8581.

J. Sakamoto et al., *Suzuki Polycondensation: Polyarylenes à la Carte*, Macromol. Rapid Commun. 2009, 30, 653-687.

M. Zhang et al., Field-Effect Transistors Based on a Benzothiadiazole—Cyclopentadithiophene Copolymer, *J. Am.. Chem. Soc.*, 2007, 129, 3472-3473.

Y. Liang et al., Development of New Semiconducting Polymers for High Performance Solar Cells, *J. Am. Chem. Soc.* 2009, 131, 56-57.

Chao-Ying Yu et al., Thiophene/Phenylene/Thiophene-Based Low-Bandgap Conjugated Polymers for Efficient Near-Infrared Photovoltaic Applications, *Chem. Materials*, vol. 21, No. 14, 2009, pp. 3262-3269.

U.S. Appl. No. 12/575,701, filed Oct. 8, 2009.

L. Huo et al., "A Polybenzo[1,2-b:4,5-b']dithiophene Derivative with Deep HOMO Level and Its Application in High-Performance Polymer Solar Cells", Angewandte Chemie Int. Ed., vol. 49, p. 1-5, (2010), Jan. 25, 2010 published online.

T. Terao et al., *Palladium-Catalyzed Cross-Coupling of Benzyl Ketones and α,β-Unsaturated Carbonyl and Phenolic Compounds with o-Dibromobenzenes to Produce Cyclic Products*, Bull. Chem. Soc. JPN., vol. 72, 1999, pp. 2345-2350.

C. Du et al., *Fused-seven ring Anthracene Derivative With two Sulfur Bridges for High Performance Red Organic light-emitting Diodes*, The Royal Society of Chemistry, 2010, 3 pgs.

U.S. Appl. No. 13/043,206, filed Mar. 8, 2011.

Great Britain Search Report in Great Britain Application No. GB 1100733.3, dated May 17, 2011.

Foreign search report dated Mar. 20, 2012 issued in German Patent Application No. 10 2011 002 579.0.

Office Action dated Jul. 5, 2012 issued in Canadian Patent Application No. 2,727,497.

\* cited by examiner

BENZODITHIOPHENE BASED MATERIALS COMPOSITIONS

BACKGROUND

Fabrication of printed organic electronics (POE) is of profound interest, as such devices are ultra-low cost, are solution processable, and possess mechanical durability and structural flexibility. One type of POE, a printed thin-film transistors (TFT), has received much attention in recent years as it is a promising, low cost alternative to silicon technology for application in, for example, active-matrix liquid crystal displays (LCDs), organic light emitting diodes, e-paper, radio frequency identification tags (RFIDs), photovoltaics.

TFTs are generally composed of a supporting substrate, three electrically conductive electrodes (gate, source and drain electrodes), a channel semiconductor layer, and an electrically insulating gate dielectric layer separating the gate electrode from the semiconductor layer. It is desirable to improve the performance of known TFTs. Performance can be measured by at least two properties: mobility and the on/off ratio. Mobility is measured in units of $cm^2/V \cdot sec$; higher mobility is desired. The on/off ratio is the ratio between the amount of current that leaks through the TFT in the off state versus the current that runs through the TFT in the on state. Typically, a higher on/off ratio is more desirable.

Thin-film transistors (TFTs) are fundamental components in modern-age electronics, including, for example, sensors, image scanners, electronic display devices and solar cells. A solar cell is a photovoltaic device used for the conversion of solar light into electrical energy. A solar cell is usable without limitation, is environmentally friendly, unlike other energy sources, and, is thus expected to become an increasingly important energy source over time.

Conventionally, solar cells were comprised of monocrystalline or polycrystalline silicon materials. However, silicon solar cells suffer from disadvantages because they possess a high manufacturing cost and cannot be applied to a flexible substrate. One possible alternative to the silicon solar cell is a polymer solar cell.

Polymer solar cells may be manufactured through spin coating, ink-jet printing, roll coating, or doctor blading, and therefore the manufacturing process associated with a polymer solar cell is much cheaper. Further, polymer solar cells are advantageous because polymer solar cells (1) possess a large coating area, (2) have the ability to form a thin-film at low temperatures and (3) can be formed from a wide variety of substrates.

Although the polymer solar cell possesses the above advantages, it is unsuitable for practical use because the power conversion efficiency for the polymer solar cell is low (about 1%) and the polymer solar cell has a short lifetime. However, the performance of the cell has begun to greatly increase through improvements in the structural morphology of the polymer blend. Presently, in the case where the power conversion efficiency of the polymer solar cell is measured under solar light conditions, a unit device having a small area (0.1 $cm^2$ or less) has power conversion efficiency of about 4 to about 5%, and a device having an area of 1 $cm^2$ has power conversion efficiency of about 3%.

Despite the advances in the development of semiconducting polymers and related materials for use in photovoltaic devices, a need exists for materials and materials processing that improve the performance of these devices. The present application seeks to fulfill this need and provides further related advantages.

SUMMARY

The present application thus achieves advances over prior polymer semiconductors and discloses a polymer semiconductor containing a polythiophene having an $M_n$ from about 1,000 to about 400,000 Daltons and derived from benzodithiophene monomer segments of Formula (1)

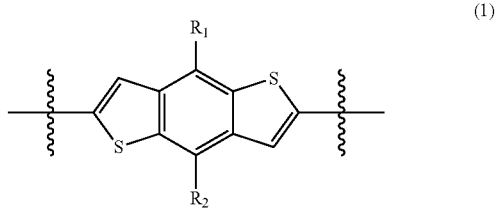

(1)

and at least one divalent linkage providing compound selected from the group consisting of an aromatic or heteroaromatic electron acceptor compound X, an aromatic or heteroaromatic compound Y and combinations thereof, wherein $R_1$ and $R_2$ are side chains independently selected from the group consisting of a hydrogen atom, a hydrocarbon group, a heteroatom and combinations thereof.

In embodiments, described herein is a method of producing a polymer semiconductor containing a polythiophene having an $M_n$ from about 1,000 to about 400,000 Daltons, the method comprising: reacting a benzoquinone-dithiophene with a reagent of the formula M-R' to form an intermediate, wherein M is MgX' or Li, X' is a halogen, and R' is a hydrocarbon group; reducing the resulting intermediate to form a 4,8-disubstituted benzodithiophene of Formula (1):

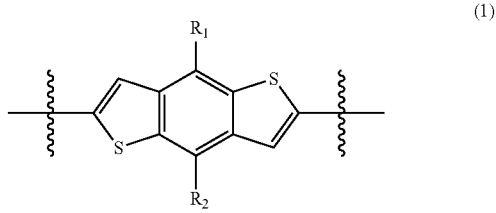

(1)

substituting the 2 and 6 positions of the benzodithiophene with at least one boron reagent or at least one halogen atom, copolymerizing at least one divalent linkage providing compound selected from the group consisting of an aromatic or heteroaromatic electron acceptor compound X and an aromatic or heteroaromatic compound Y to the 2 and 6 positions of the benzodithiophene to obtain a repeating unit; and polymerizing the repeating unit to obtain the polymer semiconductor.

In embodiments, described herein is an electronic device comprising a polymer semiconductor compound containing a polythiophene having an $M_n$ from about 1,000 to about 400,000 Daltons and derived from benzodithiophene monomer segments of Formula (1)

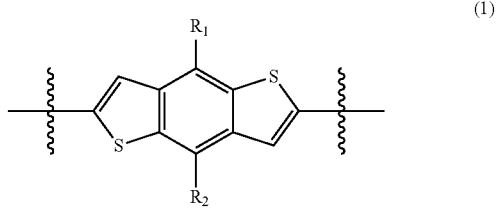

(1)

and at least one divalent linkage providing compound selected from the group consisting of an aromatic or heteroaromatic electron acceptor compound X and an aromatic or heteroaromatic compound Y, wherein $R_1$ and $R_2$ are side chains independently selected from the group consisting of a hydrogen atom, a hydrocarbon group, a heteroatom and combinations thereof.

EMBODIMENTS

Figure 1:
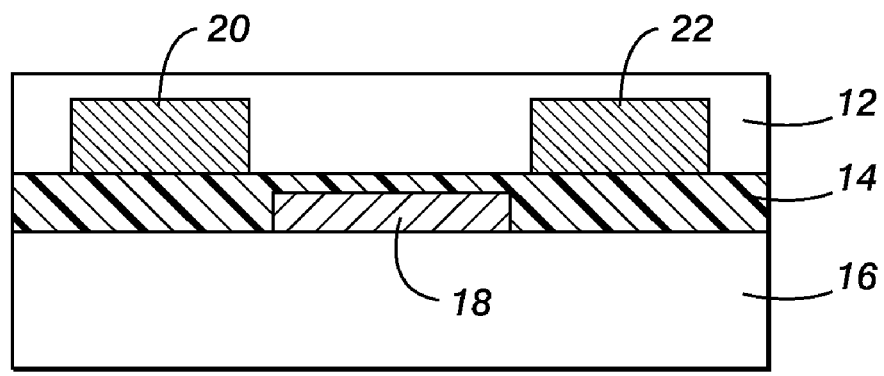
FIGS. 1 and 2 illustrate various representative embodiments of the present disclosure, and wherein polymer semiconductors of the formulas as illustrated herein are selected as the semiconductor material in thin-film transistor (TFT) configurations.

Benzodithiophene based semiconducting polymers are important materials for organic thin-film transistors and organic polymer solar cells. Examples of benzodithiophene polymers includes those described in U.S. Patent Application Pub. Nos., 2009/0256139, 2009/0256138, 2009/0181509, 2009/0179194, 2009/0140237, 2009/0140236, 2009/0124788, 2009/0114909, 2008/0146776, 2008/0108834 2008/0108833 2008/0103314, 2008/0103286, 2008/0102559, 2007/0284572, 2007/0235719, 20070148812, 2007/0145453, 2007/0145371, 2007/0145357, each of which is incorporated by reference in its entirety. This important material is soluble (allowing for ease of use in manufacturing) and exhibits high field-effect mobility in TFTs without requiring a thermal annealing step during device fabrication. Benzodithiophenes (BDTs) are generally referred to using the following structure:

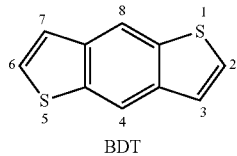

BDT

The benzodithiophene moiety core itself has very low solubility in organic solvents. However, with some modification, soluble BDT-containing polymers can be obtained, such as a polymer semiconductor containing a polythiophene having an $M_n$, from about 1,000 to about 400,000 Daltons and derived from benzodithiophene monomer segments of Formula (1)

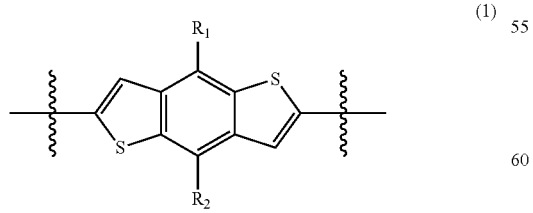

(1)

and at least one divalent linkage providing compound selected from the group consisting of an aromatic or heteroaromatic electron acceptor compound X and an aromatic or heteroaromatic compound Y, wherein $R_1$ and $R_2$ are side chains independently selected from the group consisting of a hydrogen atom, a hydrocarbon group, a heteroatom and combinations thereof.

In specific embodiments, the soluble BDT-containing polymer may be a polymer of Formula (2):

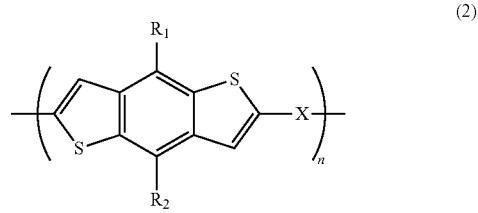

(2)

wherein $R_1$ and $R_2$ are side chains independently selected from the group consisting of a hydrogen atom, a hydrocarbon group, a heteroatom and combinations thereof, X is an aromatic or heteroaromatic electron acceptor compound, and n is the number of repeating units of from about 2 to about 5000, of from about 2 to about 3000 or from about 5 to about 1000, from about 5 to about 800, from about 5 to about 200 or from about 5 to about 75.

The number average molecular weight ($M_n$) of the polymer can be, for example, from about 1,000 to about 400,000 Daltons (Da), including from about 1,000 to about 250,000 Da, from about 2,000 to about 200,000 Da, from about 5,000 to about 75,000 Da and from about 10,000 to about 50,000 Da, and the weight average molecular weight ($M_w$) can be from about 600 to about 500,000 Da, including from about 1,500 to about 200,000 Da, from about 2,000 to about 100,000 Da, from about 2,500 to about 75,000 Da and from about 5,000 to about 50,000 Da, both as measured by gel permeation chromatography using polystyrene standards.

The polymer semiconductors described herein contain at least one divalent linkage providing compound selected from the group consisting of an aromatic or heteroaromatic electron acceptor compound X and an aromatic or heteroaromatic compound Y. The aromatic or heteroaromatic electron acceptor compound X may be a fused aromatic semiconductor compound or a fused aromatic semiconductor compound. Any electron acceptor compound may be used provided the electron acceptor compound stabilizes the quinodal form of the polymer semiconductor and thus narrows the energy gap of the polymer semiconductor.

Examples of aromatic or heteroaromatic electron acceptor compounds representable by structures II-1 to II-8:

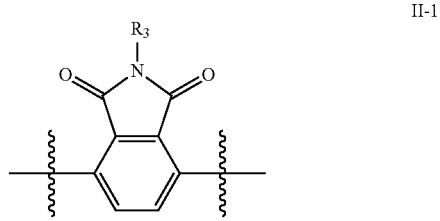

II-1

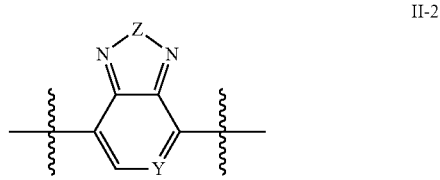

II-2 wherein Y is C or N, and
wherein Z is O, S or Se

II-3 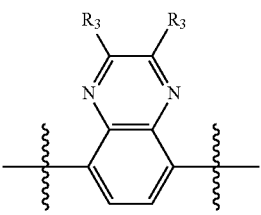

II-4 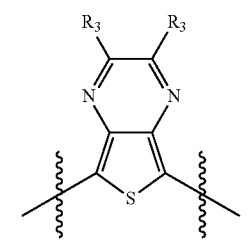

II-5 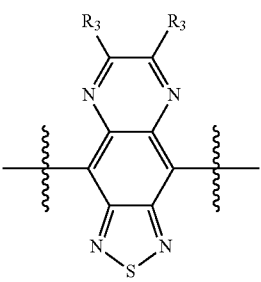

II-6 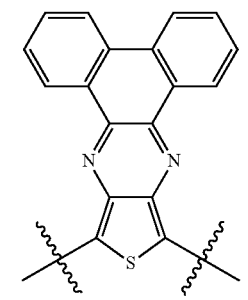

II-7 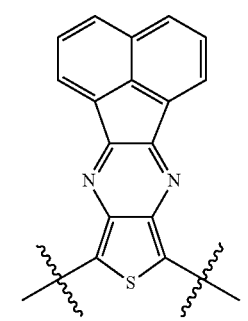

II-8 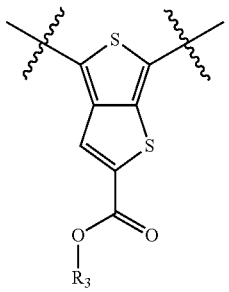

Unless otherwise indicated, in identifying the substituents for $R_1$, $R_2$ and $R_3$ for the polymer semiconductor of Formula (1), the polymer seminconductor compound of Formula (2) and the electron acceptor compounds used to prepare the polymer semiconductor of Formula (1) and Formula (2), the phrase "hydrocarbon group" encompasses both unsubstituted hydrocarbon groups and substituted hydrocarbon groups. The unsubstituted hydrocarbon group may contain, for example, from about 1 to about 50 carbon atoms, from about 2 to about 40 carbon atoms, from about 2 to about 35 carbon atoms or from about 2 to about 24 carbon atoms. Examples of the unsubstituted hydrocarbon groups may include, for example, a straight chain alkyl group, a branched alkyl group, a cycloalkyl group, an aryl group, an alkylaryl group, and an arylalkyl group. Example alkyl groups may include, for example, methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof.

The term "alkyl" refers to a substituent composed entirely of carbon atoms and hydrogen atoms which is fully saturated and of the formula $C_nH_{2n+1}$, wherein n is an integer that determines the structure of the alkyl substituent. An alkyl chain may be linear or branched. The term "aryl" refers to a substituent composed entirely of carbon atoms and hydrogen atoms which is aromatic.

The substituted hydrocarbon group may contain, for example, from about 1 to about 70 carbon atoms, from about 10 to about 60 carbon atoms and from about 20 to about 50 carbon atoms substituted with, for example, fluorine, bromine, chlorine, iodine, sulfur, amino, nitro, cyano, methoxyl, ethoxyl, propoxy, or combinations thereof. Substituted hydrocarbon groups may be, for example, a straight chain alkyl group, a branched alkyl group, a cycloalkyl group, an aryl group, an alkylaryl group, and an arylalkyl group with a heteroatom. Example alkyl groups may include, for example, methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof. In embodiments, the hydrocarbon group may be optionally substituted alkyl and optionally substituted aryl.

Unless otherwise indicated, in identifying the substituents for $R_1$, $R_2$ and $R_3$, above the term "heteroatom" includes fluorine, bromine, chlorine, iodine, sulfur, nitrogen, oxygen, or combinations thereof. Further the heteroatom can be a single atom such as, for example, chlorine or fluorine or the single atom contained in a compound such as, for example, the nitrogen atom (N) in an amino compound ($NH_2$) and the sulfur atom (S) in a $SO_2$ compound.

In further specific embodiments, $R_1$ and $R_2$ are each alkyl groups having from about 8 to about 24 carbon atoms. In other embodiments, $R_1$ and $R_2$ are identical to each other. In one specific example, $R_1$ and $R_2$ are each —$C_{12}H_{25}$.

The aromatic or heteroaromatic compound Y may be a substituted or unsubstituted thiophene, bithiophene, thienothiophene, phenylene, biphenylene, phenanthrenylene, dihydrophenanthrenylene, fluorene, carbazole, oligoarylene or mixtures thereof.

The polymer semiconductors described herein can be prepared by the conjugated cross-coupling reaction of an alkylated benzodithiophene core substituted with a boronic acid (or ester) and an electron acceptor compound disubstituted with a halogen. Such reactions are commonly referred to as "Suzuki couplings". However, the polymer semiconductors can be prepared by the conjugated cross-coupling reaction of an alkylated benzodithiophene core substituted with a halogen with an electron acceptor compounds substituted with a boronic acid (or ester).

The semiconductors described herein can also be prepared by other aryl-aryl coupling reactions, such as Yamamoto coupling, Stille coupling, or Heck coupling. An examples of suitable cross-coupling reactions are described in U.S. Patent Application Pub. No. 2009/0179198, the disclosure of which is incorporated by references herein in its entirety. Other cross-coupling reactions are described in Hou et al., *Bandgap and Molecular Energy Level Control of Conjugated Polymer Photovoltaic Materials Based on Benzo[1,2-b:4,5-b'] dithiophen*, MACROMOLECULES, 2008, 41, 6012-6018 and Usta et al. *Air-Stable, Solution-Processable n-Channel and Ambipolar Semiconductors For Thin-Film Transistors Based one the Indenofluorenebis(dicyanovinylene) Core*, J. AM. CHEM. SOC. 2008, 130 (27) 8580-8581.

As described in co-pending U.S. patent application Ser. No. 12/575,701, which is incorporated by reference herein in its entirety, one known process for preparing the alkylated benzodithiophene core is shown below Scheme 1, illustrated using the addition of a —$C_{12}H_{25}$ chain. Beginning with a benzoquinone starting material, alkyl sidechains are added to the 4 and 8 positions using an alkynylmagnesium or alkynyllithium reagent (in Scheme 1, M is MgX or Li, where X is a halogen) and reduction of the diols by use of tin(II) chloride ($SnCl_2$). The alkynyl linkage is subsequently reduced with $H_2$ gas. This three-step process uses flammable hydrogen gas, which is generally considered unsafe. In addition, this process is difficult to scale above lab-bench amounts (grams).

Scheme 1

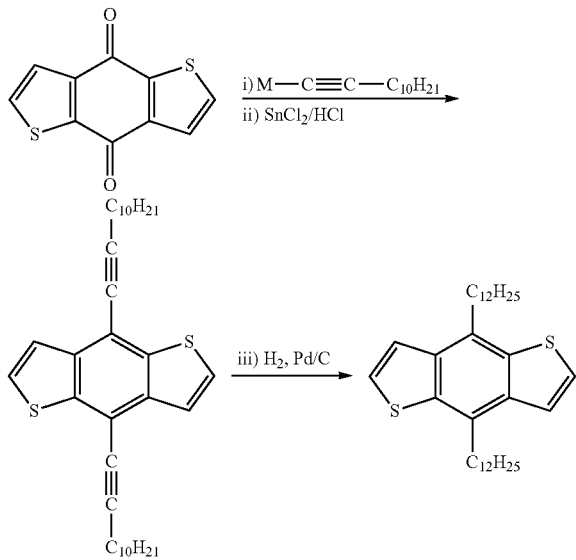

The process of alkylating the benzodithiophene core is shown below in Scheme 2, again illustrated using the addition of a —$C_{12}H_{25}$ chain. Beginning with a p-benzoquinone starting material, such as a benzodithiophene-4,8-dione, the —$C_{12}H_{25}$ chain is directly added onto the central benzene ring at the 4 and 8 positions using an organomagnesium or organolithium reagent, (in Schemes 2 and 3, M is MgX or Li, where X is a halogen), the organic portion of the reagent being linear alkyl, branched alkyl, aryl, or heteroaryl. This is followed by a reductive aromatization step. This two-step process simplifies purification and eliminates reactions using hydrogen gas. Another advantage is that this process allows the addition of substituents, such as branched alkyl chains or aryl rings, which are otherwise unaccessable (cannot be placed on the 4 and 8 locations) using the embodiment shown in Scheme 1.

Scheme 2

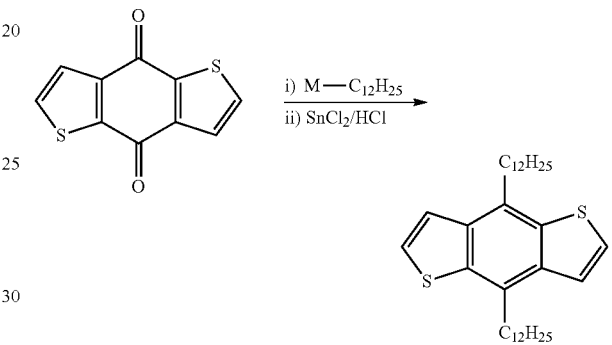

The processes of the present disclosure are illustrated more broadly in Scheme 3:

Scheme 3

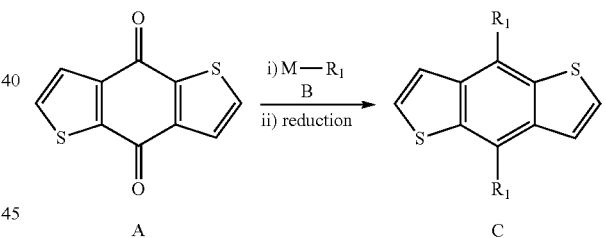

wherein M is MgX or Li, X is a halogen, and $R_1$, is linear alkyl, branched alkyl, aryl, or heteroaryl. The starting benzoquinone-dithiophene or benzodithiophene-4,8-dione A is reacted with reagent B to obtain $R_1$ substituents at the 4 and 8 positions to obtain an intermediate compound (not shown). The intermediate compound is then reduced to form the 4,8-disubstituted benzodithiophene C (Formula 2). In the reduction step, generally any reducing agent which does not affect the identity of $R_1$ can be used. However, in particular embodiments, $SnCl_2$ in an acidic solution (typically via addition of HCl) is used.

The organomagnesium or organolithium reagent M-$R_1$ has a pKa of at least 35, i.e. the pKa is 35 or higher. In other words, the reagent is very alkaline. An exemplary reagent is dodecylmagnesium bromide, which has a pKa of about 50. The pKa of benzoquinone-dithiophene is about 35. This large pKa difference generally leads to undesired side acid-base reactions which reduce the yield of the desired BDT. However, careful selection of the reaction process produces BDTs in reasonable yields. The prior art process shown in Scheme 1 utilizes an alkynylmagnesium or alkynyllithium reagent with a pKa of about 25, which avoids these competing side reactions.

In the reduction step, generally any reducing agent which does not affect the identity of $R_1$ can be used. In embodiments, the reduction is performed using a metal chloride in an acidic solution (typically via addition of HCl). Exemplary metal chlorides include tin chloride, zinc chloride, and iron chloride. However, in particular embodiments, $SnCl_2$ in an acidic solution is used.

The reagent is typically dissolved in a solvent to form a reagent solution. The solvent may be a hydrocarbon solvent, an aromatic solvent, diethyl ether, tert-butylmethyl ether, tetrahydrofuran (THF), 1,4-dioxane, or a mixture thereof. Exemplary solvents include cyclohexane, xylene, hexane, heptane, and toluene. In particular embodiments, the solvent is an anhydrous ethereal solvent.

In general, the benzoquinone-dithiophene is added to a solution of the organomagnesium or organolithium reagent in an anhydrous ethereal solvent. The concentration of the organomagnesium or organolithium reagent may be from about 0.1 M to about 1.0 M. The reaction is typically heated to a range of from about 20° C. to about 120° C., including from about 40° C. to about 80° C. The heating typically lasts for a period of from about 1 hour to about 4 hours. In other embodiments, the heating last for at least 1 hours. The reaction is cooled to room temperature and the excess organomagnesium or organolithium reagent is quenched with water. The reaction is then treated with an acidic solution of tin chloride. The concentration of the tin chloride solution is from about 1 M to about 3 M dissolved in a 10 vol % hydrochloric acid solution. The reaction is typically heated a range of from about 20° C. to about 120° C., including from about 40° C. to about 80° C. The reaction can be heated for a period of at least 1 hour, including from about 2 hours to about 24 hours. The reaction is cooled to room temperature and the product C is isolated and purified using standard methods known in the art. For example, the product can be purified by a combination of column chromatography and recrystallization. The column may use, for example, silica gel. In some embodiments, column chromatography and recrystallization are used to achieve a minimum HPLC purity of 94%.

This process has been optimized and repeated several times and gives a stable yield of around 30%.

In particular embodiments, the organomagnesium/organolithium reagent B is dissolved in a solvent like hexane or an ethereal solvent/ether containing solvent, such as tetrahydrofuran (THF), 1,4-dioxane, or tert-butylmethyl ether (TBME). The starting benzoquinone-dithiophene A is then added to the solution to begin the reaction. In particular embodiments, the reaction of the benzoquinone-dithiophene and the reagent occurs in an inert atmosphere, for example argon or nitrogen. The molar ratio of the reagent to the benzoquinone-dithiophene (reagent:benzoquinone-dithiophene) may be from about 2:1 to about 4:1, to ensure complete addition of substituents to the 4 and 8 positions.

The order of addition of the various ingredients is not important. For example, the organomagnesium/organolithium reagent can be added to a suspension of the benzoquinone-dithiophene in an ethereal solvent and the reaction can be completed as described previously with yields of around 30%.

Salt additives which modify the reactivity of organomagnesium reagents, such as LiCl or LiBr, do not affect the yield of the process and can be added to the reagent solution as well. This process has been demonstrated on a 5 gram scale with similar yields and it is expected that larger batch sizes will give consistent and reproducible yields in the 30% range.

As discussed above, the polymer semiconductors of Formula (1) can be prepared by the conjugated cross-coupling reaction of these semiconductors with substituted boronic acid (or ester or halogen) and halogenated electron acceptor compound or an electron acceptor compound substituted with boronic acid (or ester).

Suzuki polycondensation may be used to prepare regioregular, block and random copolymers. In particular, block copolymers or alternating copolymers, in particular AB-type copolymers, may be prepared from a first and a second monomer wherein both reactive groups of the first monomer are boron and both reactive groups of the second monomer are halide. The synthesis of block copolymers is described in detail for example in WO 2005/014688 A2, which is incorporated by references herein in its entirety. Other synthesis of block copolymer are described in J. Sakamoto et al., *Suzuki Polycondensation: Polyarylenes á la Carte*, MACROMOL. RAPID COMMUN. 2009, 30, 653-687 and references contained herein.

With respect to the Suzuki-Miyaura coupling method, the polymer semiconductors described herein may be produced by copolymerizing an alkylated benzodithiophene core substituted with a boron reagent to an electron acceptor compound disubstituted with a halogen. Furthermore, the polymer semiconductors described herein may also be produced by coupling the electron acceptor compound disubstituted with a halogen with an alkylated benzodithiophene core substituted with a boron reagent. The resulting polymer semiconductor from either copolymerization is an alternating copolymer. Examples of boron reagents include boronic acids, boronic esters, dialkoxyboranes and bis(alkoxy)diborons that contain a —B(OR')(OR") group, wherein R' and R" are a hydrocarbon group as defined above. Examples of halogen atoms include chlorine, fluorine, and bromine.

The benzodithiophene (substituted with a halogen atom or boron reagent at the 2 and 6 positions of the benzodithiophene core) is then copolymerized with the electron acceptor compound X and/or an aromatic or heteroaromatic compound Y, in the presence of a catalyst, to obtain a repeating unit. Examples of catalysts include a Pd(0) complexes or Pd(II) salts. Examples of Pd(0) complexes are those bearing at least one phosphine ligand such as tetrakis(triphenylphosphine (Pd $(PPh_3)_4$), tris(triortho-tolylphosphine) (Pd(o-Tol)$_3$P), Tris (dibenzylideneacetone)dipalladium(0)/triortho-tolylphosphine (Pddba/P(o-Tol)$_3$), palladium(II) (di-t-bpfPdCl$_2$), dichloro bis(tri-ortho-tolylphosphine) palladium(II) (Pd)(o-tol)$_3$PCl$_2$. Examples of Pd(II) salts include [1,1'-bis(diphenylphosphino)ferrocene]-dichloropalladium (PdCl$_2$(dppf)); PdCl$_2$(PPh$_3$)$_2$; dichloro 1,1-bis(di-tert-butylphosphino) ferrocene and palladium acetate.

The polymer semiconductors are soluble or substantially soluble in common coating solvents and thus form a polymer solution. For example, in embodiments polymer semiconductors possess a solubility of at least about 0.1 percent by weight, and more specifically, from about 0.3 percent to about 10 percent, or to about 50 percent by weight in such solvents as methylene chloride, chloroform, 1,2-dichloroethane, tetrahydrofuran, toluene, xylene, mesitylene, chlorobenzene, dichlorobenzene, and the like. Moreover, the polymer semiconductors of the formulas as illustrated herein provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

Fabrication of a printed organic electronic (POE) device using the polymer solution can be carried out by depositing the polymer solution on a substrate using any suitable liquid deposition technique at any suitable time prior to or subsequent to the formation of other optional layer or layers on the substrate. Thus, liquid deposition of the polymer solution on the substrate can occur either on a substrate or on a substrate already containing layered material, for example, a semiconductor layer and/or an insulating layer of a thin-film transistor.

The phrase "liquid deposition technique" refers to, for example, deposition of a composition using a liquid process such as liquid coating or printing technique, where the liquid is a homogeneous or heterogeneous dispersion of the polymer semiconductors in a solvent. Furthermore, the polymer solution may be deposited in any suitable pattern on the substrate.

Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. In embodiments, liquid deposition of the polymer solution deposits a layer of the polymer semiconductor having a thickness ranging from about 5 nanometers to about 5 millimeters, from about 10 nanometers to about 1000 micrometers, from about 100 nanometers to about 500 micrometers, from about 1 micrometer to about 100 micrometers and from about 5 micrometers to about 25 micrometers. The deposited polymer solution at this stage may or may not exhibit appreciable electrical conductivity.

Heating the polymer solution a temperature of, for example, at or below about 150° C. or at or below about 130° C., such as, for example, from about 50° C. to about 150° C., from about 50° C. to about 130° C., from about 50° C. to about 80° C., from about 100° C. to about 130° C. and from about 100° C. to about 120° C., to remove the solvent from the polymer solution and thus form a layer comprising the polymer semiconductors of Formula (1) on the substrate. The heating temperature is one that does not cause adverse changes in the properties of previously deposited layer(s) or the substrate (whether single layer substrate or multilayer substrate).

The heating can be performed for a time ranging from, for example, 1 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to remove the solvent from the substrate. Examples of heating techniques may include thermal heating (for example, a hot plate, an oven, and a burner), infra-red ("IR") radiation, a laser beam, microwave radiation, or UV radiation, or a combination thereof.

Electronic Devices

In embodiments, the polymer semiconductor of Formula (1) may be used in electronic devices such as thin-film transistors, diodes and photovoltaic devices, such as polymer solar cells (PSCs). The use of the present polymer as a semiconductor in electronic devices is illustrated herein using thin-film transistors and photovoltaic devices.

In embodiments, there is provided a thin-film transistor comprising:
(a) a gate dielectric layer;
(b) a gate electrode;
(c) a semiconductor layer;
(d) a source electrode;
(e) a drain electrode; and
(f) a substrate layer
wherein the gate dielectric layer, the gate electrode, the semiconductor layer, the source electrode, the drain electrode and the substrate layer are in any sequence as long as the gate electrode and the semiconductor layer both contact the gate dielectric layer, and the source electrode and the drain electrode both contact the semiconductor layer, and the semiconductor layer is comprised of the polymer semiconductor compounds described herein.

In embodiments and with further reference to the present disclosure, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to about 100 millimeters with a specific thickness being from about 50 to about 100 micrometers, especially for a flexible plastic substrate, and from about 1 to about 10 millimeters for a rigid substrate such as glass or silicon.

The gate dielectric layer, which can separate the gate electrode from the source and drain electrodes, and in contact with the semiconductor layer, can generally be an inorganic material film, an organic polymer film, or an organic-inorganic composite film. The thickness of the gate dielectric layer can be, for example, from about 10 nanometers to about 1 micrometer with a more specific thickness being about 100 nanometers to about 500 nanometers. Examples of inorganic materials suitable as the dielectric layer may include silicon oxide, silicon nitride, aluminum oxide, barium titanate, barium zirconate titanate and the like. Examples of organic polymers for the dielectric layer may include polyesters, polycarbonates, poly(vinyl phenol), polyimides, polystyrene, poly(methacrylate)s, poly(acrylate)s, epoxy resin and the like. Examples of inorganic-organic composite materials may include nanosized metal oxide particles dispersed in polymers, such as polyester, polyimide, epoxy resin and the like. The gate dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of polymer semiconductors of the Formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of polymer semiconductors of the present disclosure.

The gate electrode can be a thin metal film, a conducting polymer film, a conducting film generated from a conducting ink or paste, or the substrate itself (for example heavily doped silicon). Examples of the gate electrode materials may include gold, silver, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer may be prepared by vacuum evaporation, sputtering of metals or conductive metal oxides, coating from conducting polymer solutions or conducting inks, or dispersions by spin coating, casting or printing. The thickness of the gate electrode layer may be, for example, from about 10 nanometers to about 10 micrometers, and a specific thickness may be, for example, from about 10 to about 200 nanometers for metal films, and about 1 to about 10 micrometers for polymer conductors.

The source and drain electrode layer can be fabricated from materials which provide a low resistance ohmic contact to the semiconductor layer. Typical materials suitable for use as source and drain electrodes may include those of the gate electrode materials such as gold, nickel, aluminum, platinum, conducting polymers, and conducting inks. Typical thickness of this layer may be, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volts to about −80 volts is applied to the drain electrode to collect the charge carriers transported across the semiconductor channel when a voltage of generally, for example, about +10 volts to about −80 volts is applied to the gate electrode.

In embodiments, the annealing temperature for a thin-film transistor comprised of a polymer semiconductor layer having the polymer semiconductor compounds according to the Formulas herein is about or below about 150° C., about or below about 125° C. or about or below about 100° C.

FIG. 1 illustrates a TFT configuration comprised of a substrate (16) in contact with a gate electrode (18) and with a gate dielectric layer (14) containing the gate electrode (18). On top of the gate dielectric layer (14) are the source electrode (20) and the drain electrode (22). Above and situated between the source electrode (20) and the drain electrode (22) is the polymer semiconductor layer (12), The gate electrode (18) can be included in the substrate (16), in the gate dielectric layer (14), and the like throughout.

Figure 2:
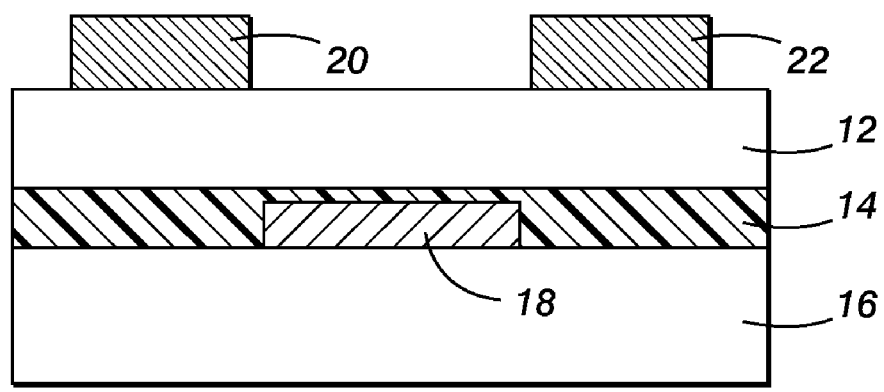

FIG. 2 illustrates a TFT configuration comprised of a substrate (16) in contact with a gate electrode (18) and with a gate dielectric layer (14) containing the gate electrode (18). On top of the gate dielectric layer (14) is the polymer semiconductor layer (12). Above the polymer semiconductor layer (12) are the source electrode (20) and the drain electrode (22).

Other known suitable materials not recited herein for the various components of the TFT devices of the present disclosure can also be selected in embodiments.

In embodiments, the polymer semiconductors described herein may also be used in photovoltaic devices, such as polymer solar cells (PSCs). The inclusion of the polymer semiconductors described may lead to a photovoltaic device with a lower manufacturing cost, possess a low band gap polymer for broad light absorption that leads to increased efficiency in the photovoltaic device and is lightweight and has increased flexibility when compared to silicon solar cells.

In embodiments, there is provided a photovoltaic device comprising:

(a) a first electrode;
(b) a second electrode;
(c) a thin-film layer; and
(d) a substrate wherein the substrate, the first electrode, the second electrode and the thin-film layer are in any sequence as long as the first electrode and the second electrode both contact the thin-film layer, and the thin-film layer is comprised of the polymer semiconductor compounds described herein.

In embodiments and with further reference to the present disclosure, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to about 100 millimeters with a specific thickness being from about 50 to about 100 micrometers, especially for a flexible plastic substrate, and from about 1 to about 10 millimeters for a rigid substrate such as glass or silicon.

Situated, for example, between and in contact with the first and second electrode is the thin-film layer comprised of polymer semiconductors of the formulas as illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of polymer semiconductors of the present disclosure.

The first and second electrode can be a thin metal film, a conducting polymer film, a conducting film generated from a conducting ink or paste, or the substrate itself (for example heavily doped silicon). Examples of the first and second electrode materials may include silver, gold, chromium, fluorine-doped tin oxide ("FTO"), $ZnO$—$Ga_2O_3$, $ZnO$—$Al_2O_3$, and $SnO_2$—$Sb_2O_3$. indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The first electrode and/or second electrode layer be prepared by vacuum evaporation, sputtering of metals or conductive metal oxides, coating from conducting polymer solutions or conducting inks, or dispersions by spin coating, casting or printing. The thickness of the first and/or second electrode layer may be, for example, from about 10 nanometers to about 10 micrometers, and a specific thickness may be, for example, from about 10 to about 200 nanometers for metal films, and about 1 to about 10 micrometers for polymer conductors.

Figure 3:
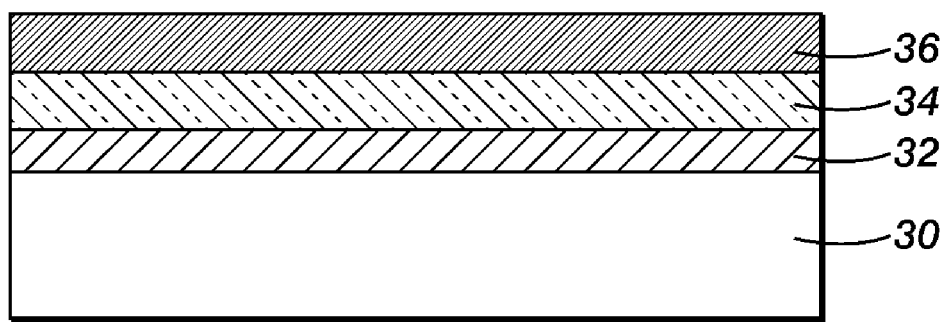
FIG. 3 illustrates various representative embodiments of the present disclosure, and wherein polymer semiconductors of the formulas as illustrated herein are selected as the photoactive layer in polymer solar cell (PSC) configurations.

FIG. 3 illustrates a photovoltaic cell configuration comprised of a substrate (30) in contact with a first electrode (32). On top of the first electrode (32) is the thin-film layer (34) comprised of the polymer semiconductors described herein. Above the thin-film layer (34) is the second electrode (36).

EXAMPLES

Example 1

Synthesis of 4,8-didodecylbenzo[1,2-b:4,5-b']dithiophene monomer

In a 500 mL round-bottomed flask, anhydrous tetrahydrofuran (150 mL) was treated with a 1 M solution of dodecyl magnesium bromide (34 mL, 34 mmol). Solid 4,8-dehydrobenzo[1,2-b:4,5-b']dithiophene-4,8-dione (2.50 grams, 11.4 mmol) was added in one portion and the reaction was heated to 60° C. under an argon atmosphere. After 90 minutes, the heating bath was removed and the reaction was cooled to room temperature and carefully quenched with water (20 mL). The reaction was treated with a solution of tin(II) chloride (12.91 grams, 68.1 mmol) in 10 vol % hydrochloric acid solution (30 mL) and was heated to 60° C. After 18 hours, the heating bath was removed and the reaction was cooled to room temperature. The layers were separated and the organic layer was dried (using $MgSO_4$), filtered and concentrated using a rotary evaporator. The crude product was passed through a short $SiO_2$ plug using hexanes as eluent, and the product was recrystallized from hexanes yielding 4,8-didodecylbenzo[1,2-b:4,5-b']dithiophene as a white solid (1.7 grams, 28% yield). The structure was confirmed by $^1H$ and $^{13}C$ NMR spectroscopy.

Example 2

Synthesis of 2,6-dibromo-4,8-didodecylbenzo[1,2-b:4,5-b']dithiophene monomer

In a 250 mL round-bottomed flask, 6.36 g (12.1 mmol) of the 4,8-didodecylbenzo[1,2-b:4,5-b']dithiophene prepared in Example 1 was dissolved in a mixture of dichloromethane (150 ml) and acetic acid (37.5 ml). The reaction was treated with N-bromosuccinimide (4.40 g, 24.7 mmol) portionwise for over 2 min and stirred in the dark for 18 hours. The reaction mixture was diluted with $CH_2Cl_2$ and washed with water (75 mL) and a 1 M NaOH solution (2×75 mL). The organic layer was dried ($MgSO_4$), filtered and concentrated using a rotary evaporator. The crude product was recrystallized from hexanes yielding 2,6-dibromo-4,8-didodecylbenzo[1,2-b:4,5-b']dithiophene as a pale yellow solid (5.3 grams, 64% yield). The structure was continued by 1H and $^{13}C$ NMR spectroscopy.

Example 3

Synthesis of Polymer Semiconductor Compound Via Suzuki Polymerization

In a 100 mL Schlenk flask 2,6-dibromo-4,8-didodecylbenzo[1,2-b:4,5-b']dithiophene (prepared in Example 2) (685 mg, 1 mmol, 1 molar equiv.) and 4,7-bis(4,4,5,5-tetramethyl-1,3,2-dioxaborolan-2-yl)benzo[c][1,2,5]thiadiazole (388 mg, 1 mmol, 1 molar equiv) is dissolved in a mixture of toluene (20 mL) and an aqueous 2 M $K_2CO_3$ solution (10 mL) and aliquat 336 (0.1-0.5 mL). The mixture would then be thoroughly deoxygenated with Ar for 1 h. The reaction would then be treated with Pd(PPh3)4 (1-5 mol-%) and heated at 80-90° C. After 72 h phenyl boronic acid and bromobenzene would then be added to end cap the copolymer chain. The crude copolymer would then be precipitated methanol solution, collected by vacuum filtration and purified using a combination of Soxlet extraction and precipitation with methanol. Example 3 is based upon Scheme 4 illustrated below and the Suzuki polymerization reaction described in M. Zhang et al., *Field-Effect Transistors Based on a Benzothiadiazole-Cyclopentadithiophene Copolymer, J. Am. Chem. Soc.* 2007, 129, 3472-3473.

Scheme 4

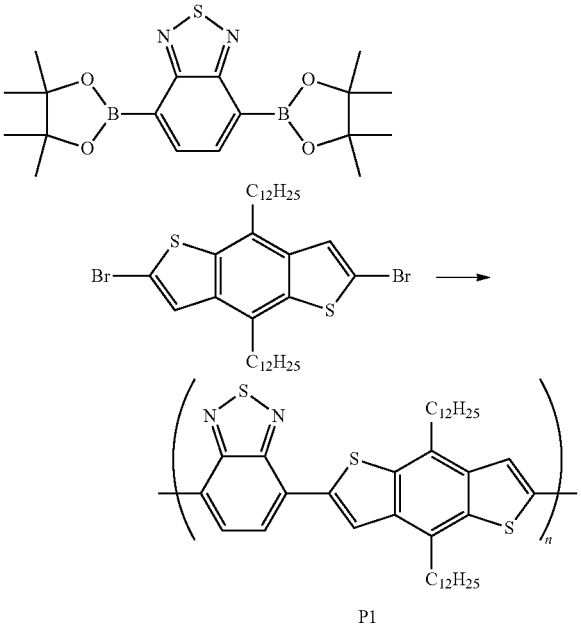

P1

Example 4

Molecular Modeling

The band gap of copolymer P1 (labeled above in Scheme 4) (n=3) was estimated as 2.1 eV using Density Functional Theory (B3LYP, 6-31G*) calculations on a commercially available software package (Spartan'06™ for Windows). Note the calculations are in gas phase and do not account for packing effects. It is expected that the band gap of the material in the solid-state would be even smaller if the conjugation length (n>3) and packing effects are considered.

It will be appreciated that various aspects of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A polymer semiconductor containing a polythiophene having an $M_n$, from about 1,000 to about 400,000 Daltons and derived from benzodithiophene monomer segments of Formula (1)

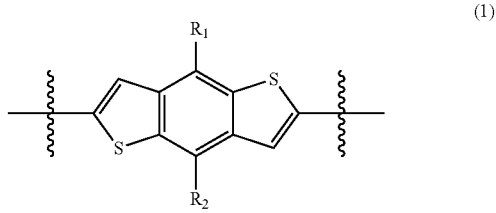

(1)

and at least one aromatic or heteroaromatic electron acceptor compound X, wherein R₁ and R₂ are side chains independently selected from the group consisting of a hydrogen atom, a hydrocarbon group, a heteroatom selected from the group consisting of fluorine, bromine, chlorine, iodine, sulfur and nitrogen, and combinations thereof, and wherein the electron acceptor compound X is selected from the group consisting of electron acceptor compounds of:

(a)
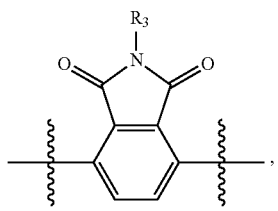

wherein $R_3$ is a side chain independently selected from the group consisting of a hydrogen atom, a hydrocarbon group, a heteroatom and combinations thereof;

(b)
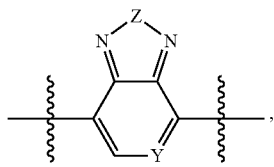

wherein Y is N and Z is O, S or Se;

(c)
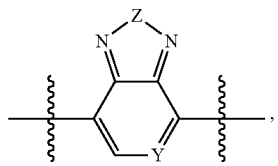

wherein Y is C or N and Z is O or Se;

(d)
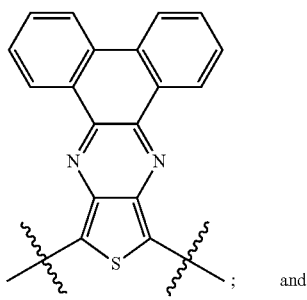
; and (e)
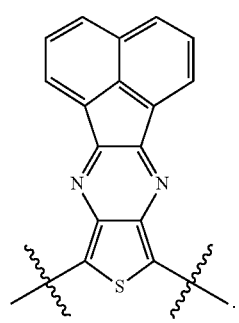
.

2. The polymer semiconductor of claim 1, wherein $R_1$ and $R_2$ are a hydrocarbon group.

3. The polymer semiconductor of claim 2, wherein the hydrocarbon group is a linear or branched alkyl group or a substituted or unsubstituted aryl group.

4. The polymer semiconductor of claim 1, wherein the polymer semiconductor is a polymer of Formula (2)

(2)
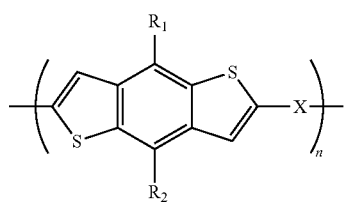

wherein n is the number of repeating units of from about 2 to about 5000.

5. The polymer semiconductor of claim 4, wherein n is the number of repeating units of from about 5 to about 800.

6. A method of producing a polymer semiconductor containing a polythiophene having an $M_n$, from about 1,000 to about 400,000 Daltons, the method comprising:

reacting a benzoquinone-dithiophene with a reagent of the formula M-R' to form an intermediate, wherein M is MgX' or Li, X' is a halogen, and R' is a hydrocarbon group;

reducing the resulting intermediate to form a 4,8-disubstituted benzodithiophene of Formula (1):

(1)
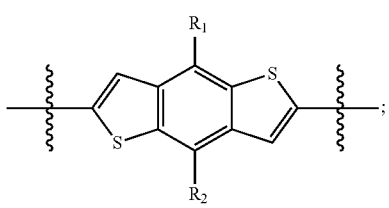
;

substituting the 2 and 6 positions of the benzodithiophene with at least one boron reagent or at least one halogen atom;

copolymerizing an aromatic or heteroaromatic electron acceptor compound X to the 2 and 6 positions of the benzodithiophene to obtain a repeating unit;

wherein the aromatic or heteroaromatic electron acceptor compound X is selected from the group consisting of electron acceptor compounds of:

(a)
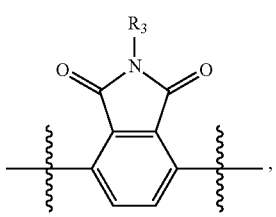

wherein $R_3$ is a side chain independently selected from the group consisting of a hydrogen atom, a hydrocarbon group, a hereatom and combinations thereof;

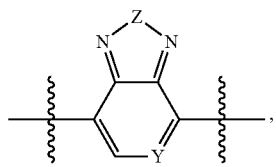

wherein Y is N and
Z is O, S or Se;

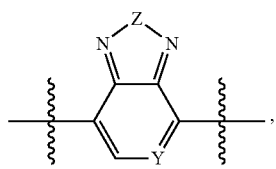

wherein Y is C or N and
Z is O or Se;

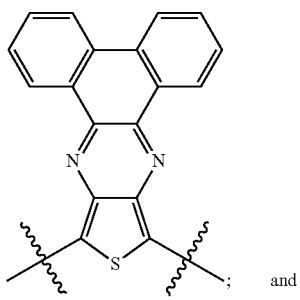

; and

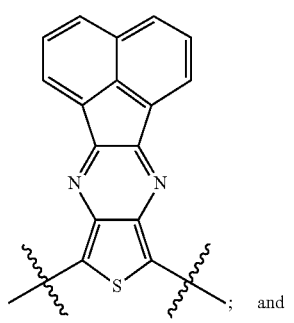

; and copolymerizing the repeating units to obtain the polymer semiconductor.

7. The method of claim 6, wherein the aromatic or heteroaromatic electron acceptor compound X is substituted with at least one boron reagent or at least one halogen atom.

8. The method of claim 6, wherein the 4,8-disubstituted benzodithiophene of Formula (1) is copolymerized with the aromatic or heteroaromatic electron acceptor compound X at the 2 and 6 positions using a Suzuki-Miyaura polycondensation reaction.

9. An electronic device comprising the polymer semiconductor compound of claim 1.

10. The electronic device of claim 9, wherein the electronic device is a thin-film transistor or a photovoltaic device.

11. A polymer semiconductor containing a polythiophene having an $M_n$ from about 1,000 to about 400,000 Daltons and derived from benzodithiophene monomer segments of Formula (2)

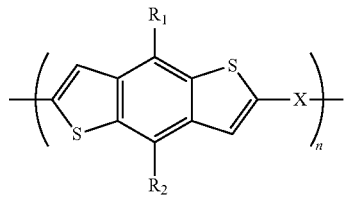

and at least one aromatic or heteroaromatic electron acceptor compound X, wherein n is the number of repeating units of from about 2 to about 5000, and wherein the aromatic electron acceptor or the heteroaromatic electron acceptor compound X is selected from the group consisting of electron acceptor compounds of:

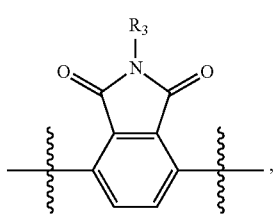

wherein $R_3$ is a side chain independently selected from the group consisting of a hydrogen atom, a hydrocarbon group, a heteroatom and combinations thereof;

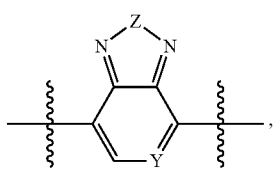

wherein Y is N and
Z is O, S or Se;

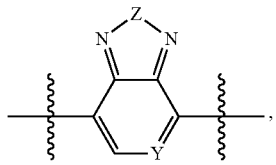

wherein Y is C or N and
Z is O or Se;

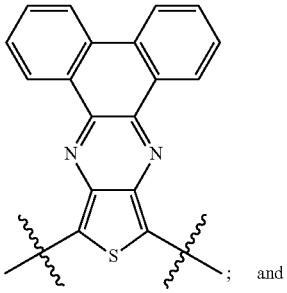

; and

-continued
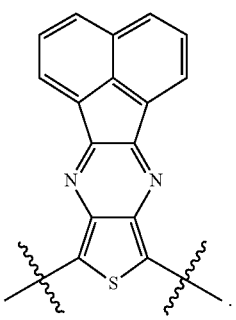
(e)
12. The polymer semiconductor of claim 1, wherein the $R_1$ and $R_2$ side chains are each a hydrocarbon group.
13. The polymer semiconductor of claim 1, wherein the electron acceptor compound X is selected from the group consisting of electron acceptor compounds of:
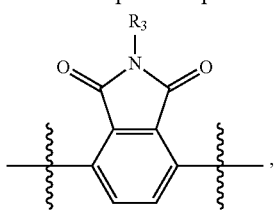
-continued
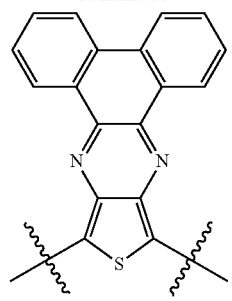 and
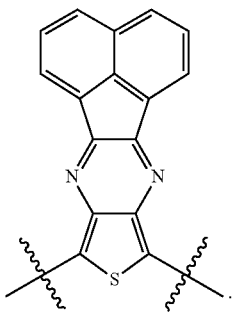
* * * * *